(12) United States Patent
Lopez-Diaz et al.

(10) Patent No.: US 9,673,834 B2
(45) Date of Patent: Jun. 6, 2017

(54) SUCCESSIVE APPROXIMATION METHOD WITH A NONLINEAR CHARACTERISTIC

(71) Applicant: Lantiq Beteiligungs-GmbH & Co. KG, Neubiberg (DE)

(72) Inventors: Daniel Lopez-Diaz, Villach (AT); Thomas Niederfriniger, Villach (AT); Alexander Kahl, Landskron (AT); Steffen Trautmann, Villach (AT)

(73) Assignee: Lantiq Beteiligungs-GmbH & Co. KG, Neubiberg (DE)

( * ) Notice: Subject to any disclaimer, the term of this patent is extended or adjusted under 35 U.S.C. 154(b) by 0 days.

(21) Appl. No.: 15/226,976

(22) Filed: Aug. 3, 2016

(65) Prior Publication Data

US 2017/0041015 A1    Feb. 9, 2017

(30) Foreign Application Priority Data

Aug. 5, 2015   (DE) .................. 10 2015 112 852

(51) Int. Cl.
  *H03M 1/38*   (2006.01)
  *H03M 1/12*   (2006.01)
(52) U.S. Cl.
  CPC ............ *H03M 1/38* (2013.01); *H03M 1/124* (2013.01)
(58) Field of Classification Search
  CPC ................................ H03M 1/38; H03M 1/124
  USPC ........................................ 341/155, 156, 161
  See application file for complete search history.

(56) References Cited

U.S. PATENT DOCUMENTS

| 4,980,634 A | 12/1990 | Mallinson |
| 5,920,274 A | 7/1999 | Gowda et al. |
| 7,015,853 B1 * | 3/2006 | Wolff .................. H03M 1/0641 341/155 |
| 7,432,839 B2 | 10/2008 | Christ |
| 7,642,946 B2 * | 1/2010 | Wong .................... H03M 1/002 341/144 |
| 8,134,487 B2 * | 3/2012 | Harpe .................. H03M 1/125 341/155 |
| 8,736,480 B1 | 5/2014 | Cowley et al. |

FOREIGN PATENT DOCUMENTS

| JP | S5544256 A | 3/1980 |
| JP | S5797222 A | 6/1982 |

OTHER PUBLICATIONS

"Software-Calibrated, 50 MHz to 9 GHz, RF Power Measurement System." Circuits from the Lab Reference Circuits. Analog Devices. Circuit Note CN-0178. pp. 1-5.

(Continued)

Primary Examiner — Jean B Jeanglaude
(74) Attorney, Agent, or Firm — Eschweiler & Potashnik, LLC

(57) ABSTRACT

A circuit with a successive approximation analog-to-digital converter utilizes a feedback path and is operated for example in accordance with the successive approximation method. The feedback path is configured to translate a digital signal in accordance with a prescribed function and to furthermore convert the translated digital signal into an analog feedback signal. For example, the prescribed function can be an exponential function. As such, it can be possible to convert an input signal into an output signal by means of a nonlinear characteristic.

20 Claims, 7 Drawing Sheets

(56) References Cited

OTHER PUBLICATIONS

Gilbert, Barrie. Noise Figure and Logarithmic Amplifiers The Wit and Wisdom of Dr. Leif6*]. Analog Dialogue 42-06, Jun. (2008). pp. 1-6.
Dinesh K. Anvekar, et al.; "A Programmable Nonlinear ADC Using Optimal-Sized ROM"; IEEE Transactions on Instrumentation and Measurement, vol. 40, No. 6, Dec. 1991, p. 1031-1035.
B. D. Smith, et al.; "Coding by Feedback Methods"; Proceedings of the I.R.E.; Aug. 1953, p. 1053-1058.
C.K. Yuen; "Flexible A/D Conversion Using a ROM in Place of a SAR"; Proceedings of the IEEE, vol. 71, No. 12, Dec. 1983, p. 1454-1456.

* cited by examiner

SUCCESSIVE APPROXIMATION METHOD WITH A NONLINEAR CHARACTERISTIC

CROSS REFERENCE TO RELATED APPLICATIONS

This application claims priority to German Patent Application number 10 2015 112 852.7, filed on Aug. 5, 2015, and is hereby incorporated by reference in its entirety.

FIELD

Different embodiments of this disclosure relate to a circuit that comprises a successive approximation analog-to-digital converter and to a hybrid analog-to-digital converter. In particular, different embodiments relate to techniques in order to convert an analog input signal into a digital output signal using a nonlinear characteristic.

BACKGROUND

In different applications, it can be worthwhile to determine the power of an analog AC voltage signal (AC signal) as an input signal over a wide dynamic range as a digital value. Different techniques are known for this, such as peak value detection or a limiting amplifier, for example. However, such techniques have the disadvantage that they do not determine an effective value, such as the root mean square (RMS), for example. Therefore, such techniques can particularly have a dependency on a modulation technique for the AC signal and/or a dependency on a ratio between peak power and mean value, for example as described by crest factor.

In order to determine the RMS value, techniques can square the AC signal and then use a logarithmic analog amplifier to translate it into the analog domain. Subsequently, analog-to-digital (AD) conversion by means of an analog-to-digital converter (ADC) can take place in order to obtain a digital output signal. By way of example, this can be done using an ADC that is operated in accordance with the successive approximation method; such an ADC is frequently also referred to as a successive approximation ADC (SAR-ADC).

However, techniques for determining the RMS value have the disadvantage that the logarithmic amplification in the analog domain by means of the analog amplifier means that there can be a significant dependency on constraints, such as process tolerances, temperature and the supply voltage, for example. The output signal can then be accordingly distorted. Thus, an accuracy of the AD conversion can decrease.

SUMMARY

There is therefore a need for improved techniques of AD conversion. In particular, there is a need for techniques that allow an input signal that has a power curve with a wide dynamic range to be converted reliably and accurately.

This object is achieved by the features of the independent claims. The dependent claims define embodiments.

According to one embodiment, the present disclosure relates to a circuit. The circuit comprises an SAR-ADC. The SAR-ADC comprises a feedback path. The feedback path is configured to translate a digital signal in accordance with a prescribed function and to furthermore convert the translated digital signal into an analog feedback signal.

According to one embodiment, the present disclosure relates to a method. The method comprises translation of a digital signal in accordance with a prescribed function by means of a feedback path of an SAR-ADC. The method furthermore comprises conversion of the translated digital signal into an analog feedback signal by means of or via the feedback path of the SAR-ADC.

According to one embodiment, the disclosure relates to a hybrid ADC. The hybrid ADC comprises a comparator that is configured to compare or generate a comparison of an analog input signal with a feedback signal and to take the comparison as a basis for providing a result signal. The input signal has a power curve having a first range and a second range. The first range corresponds to lower powers than the second range. The hybrid ADC furthermore comprises an SAR register that is configured to adjust a digital signal iteratively on the basis of the result signal. The hybrid ADC is configured to use a nonlinear characteristic to convert the first range of the input signal with a recognizable sensitivity.

The features set out above and features that are described below can be used not only in the relevant combinations that are explicitly set out but also in further combinations or in isolation without departing from the scope of protection of the present disclosure.

DETAILED DESCRIPTION OF EMBODIMENTS

Figure 1:
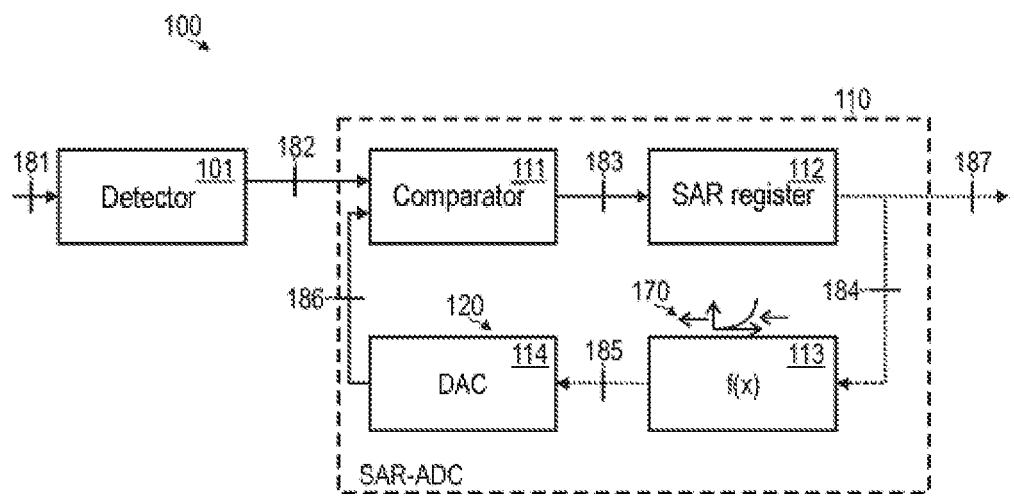
FIG. 1 illustrates a circuit according to different embodiments, wherein the circuit comprises an SAR-ADC that has a feedback path, wherein a logic element is arranged in the feedback path and is configured to translate a digital signal in accordance with a prescribed function.

The present disclosure is explained in more detail below on the basis of preferred embodiments with reference to the drawings. In the figures, like reference symbols denote like or similar elements. The figures are schematic representations of different embodiments of the disclosure. Elements shown in the figures are not necessarily shown to scale. Rather, the different elements shown in the figures are reproduced such that their function and general purpose becomes comprehensible to a person skilled in the art. Connections and couplings shown in the figures between functional units and elements can also be implemented as indirect connection or coupling. A connection or coupling can be implemented in wired or wireless form. The functional units can be implemented as hardware, software or a combination of hardware and software.

The text below describes techniques that relate to AD conversion of an analog input signal; as such, a digital output signal is obtained. In particular, the AD conversion is based on an SAR-ADC or the successive approximation method. In this case, techniques are used that allow particularly accurate and reliable AD conversion to be performed for the input signal, which has a wide dynamic range. The dynamic range can refer to a particular characteristic quantity of the input signal, such as power, for example. In this case, the SAR-ADC can, in accordance with different embodiments, be configured to use a nonlinear characteristic to convert a first range of the power curve of the input signal with a high sensitivity and to convert a second range of the power curve of the input signal with a low sensitivity. As such, the effect that can be achieved is that the output signal can be provided at a sufficient or, in particular, recognizable sensitivity over the wide dynamic range of the power curve of the input signal.

In different embodiments, the nonlinear characteristic of the AD conversion can be configured for providing an RMS value of the power of the input signal. In this respect, a logarithmic scale, such as a dB scale, for example, can be translated into a linear scale, in particular. Such techniques can be used in particular in relation to input stages for wireless transmission of a radio channel. One specific application could be wireless local area network (WLAN) transmission in accordance with the (Institute of Electrical and Electronics Engineers) IEEE 802.11 family of standards. A further area of application could be wireless transmission by means of radio cell technology, for example as specified by the Third Generation Partnership Project (3GPP). A further area of application could be wireless transmission in connection with Internet of Things (IOT) technology. A reason for such application is that the power of the input signal typically can vary in a wide dynamic range, for example in the range of 80-90 dB. Such techniques can also be used in the area of the "connected home", for example, in connection with a WLAN access point (WLAN access point of a gateway).

FIG. 1 illustrates a circuit 100 that comprises an SAR-ADC 110. For example, the circuit 100 can be arranged on a single semiconductor chip or bonded chip. The SAR-ADC 110 receives an analog input signal 182 and outputs a digital output signal 187. The digital output signal 187 can be indicative of an amplitude of the analog input signal 182, for example. The digital output signal 187 can be for example indicative of an RMS value of the input signal 182.

The SAR-ADC 110 receives the input signal 182 from a detector 101. The detector 101 can be configured to provide the input signal 182 on the basis of a physical measured variable 181, for example.

In different embodiments, it could also be possible for the detector 101 to be a multiplier or a squaring element, for example, which modifies an analog signal 181 in order to obtain the input signal 182. In different embodiments, the detector 101 can also implement a sample and hold circuit. For example, it could be possible for the detector 101, in this context, to have a capacitor that implements a low pass filter. Alternatively or additionally, in different embodiments, it could also be possible for the detector 101 to implement an integrator. As such, the effect that can be achieved, for example, is that the signal 181 is integrated over particular time ranges and, on the basis of an integral, the input signal 182 is produced and is provided for the SAR-ADC 110. Alternatively or additionally, in different embodiments, it could also be possible for the detector 101 to implement an analog amplifier circuit. For example, it could be possible for the detector 101, depending on the operating state, to apply various gain factors of the amplifier circuit. Examples of an operating state comprise for example a characteristic of a detector 101, a selected dynamic range in the detector 101 and a gain factor of the detector 101.

In general, the circuit 100 can be set up to convert a wide variety of input signals 181. In particular, the input signal 181 can be an alternating field (alternating current, AC) radiofrequency signal in the megahertz or gigahertz range, for example. It could be possible, for example, for the input signal 181 to be a modulated radiofrequency signal.

For the AD conversion, the SAR-ADC 110 uses techniques of the successive approximation method. In particular, the SAR-ADC 110 comprises a comparator 111, an SAR register 112 and a feedback path 120, as known from reference implementations of the SAR-ADC 110. The comparator 111 is configured to compare the analog input signal 182 with an analog feedback signal 186 provided by the feedback path 120 and, on the basis of this comparison, to provide a result signal 183 for the SAR register 112. For example, the comparator 111 could be set up to output a logic ONE, provided that the analog input signal 182 has an amplitude that is greater than an amplitude of the feedback signal 186. Accordingly, the comparator 111 could be set up to output a logic ZERO, provided that the analog input signal 182 has an amplitude that is smaller than the amplitude of the feedback signal 186.

The SAR register 112 is configured to output a digital signal 184 and to adjust the digital signal 184 iteratively on the basis of the result signal 183 provided by the comparator 111. When the iterative adjusting has concluded (e.g., the AD conversion has concluded), the digital signal 184 corresponds to the output signal 187.

The SAR register 112 can be configured to store a value of the digital signal 184 during the process of AD conversion. For example, the digital signal 184 or the output signal 187 can have a bit sequence of prescribed length, for example 8 bits. For example, an initial value of the digital signal 184 can be set to ZERO at the beginning of the process of AD conversion. Subsequently, the most significant bit (MSB) can be set to ONE and the comparator can check by means of, or by generating, a comparison of whether the amplitude of the input signal 182 is greater than the amplitude of the digital signal 184 adjusted in this manner or greater than the amplitude of the feedback signal 186 that corresponds to the analog representation of the adjusted digital signal 184.

Depending on the result of the comparison, the MSB can be adjusted or remains set to ONE. Subsequently, the next bit, MSB-1, can be set to ONE; depending on the result of the comparison by the comparator 111, the MSB-1 can in turn be adjusted to ZERO or remain set to ONE.

This process of iterative adjustment can subsequently be performed for all further bit positions of the digital signal 184, until finally the least significant bit (LSB) is definite. Subsequently, the output signal 187 can be provided.

SAR-ADCs operating on the basis of the successive approximation method can have a linear characteristic for the AD conversion of the input signal into the output signal. In particular, no translation of the digital signal 184 takes place.

The SAR-ADC 110 can thus be configured to convert the analog input signal 182 in accordance with a nonlinear characteristic. The text below describes details in relation to the feedback path 120. In particular the feedback path 120 is configured to prompt the nonlinear characteristic of the SAR-ADC 110. In particular, the feedback path 120 is configured to translate the digital signal 184 in accordance with a prescribed function 170 and to furthermore convert the translated digital signal 184 into the analog feedback signal 186. The analog feedback signal 186 is subsequently transferred to the comparator 111.

In detail, the feedback path 120 comprises a digital logic element 113 and a digital-to-analog (DA) converter element 114. The digital logic element 113 operates in the digital domain. The digital logic element 113 is configured to translate the digital signal 184 in accordance with the prescribed function 170. The DA converter element 114 is configured to convert the translated digital signal 185 into the analog feedback signal 186 and to transfer the analog feedback signal 186 to the comparator 111.

Translation of the digital signal 184 prompts the nonlinear characteristic of the SAR-ADC 110. Depending on the embodiment of the prescribed function 170, the nonlinear characteristic can be modified. Since logic in the form of the comparator 111 and the logic element 113 and the SAR register 112 is arranged both in the analog domain and in the digital domain, the SAR-ADC 110 can also be referred to as a hybrid analog-to-digital converter.

The nonlinear characteristic of the SAR-ADC 110 can be achieved even though the DA converter element 114 can be embodied as a linear DA converter element 114, for example, that is to say itself has a linear characteristic for the DA conversion.

The translation of the digital signal 184 in the digital domain allows particularly stable and reliable operation of the SAR-ADC 110 to be achieved. In particular, translation of the digital signal 184 in the digital domain can now have no or no significant dependency on temperature or other external influences, such as offset voltages or process parameters, for example. As such, the effect that can be achieved is that the SAR-ADC 110 implements the nonlinear characteristic reliably and robustly. Furthermore, the required analog circuitry can be reduced. For example, a logarithmic analog amplifier can be dispensable.

In one specific scenario, the prescribed function 170 corresponds to an exponential function. In such a case, the exponential prescribed function 170 prompts the input signal 182 to be converted into the output signal 187 using a logarithmic nonlinear characteristic. This can be used to provide the output signal 187 in a manner indicative of the input signal 182 in a linear-in-dB scale. This can be worthwhile in particular in connection with the determination of the RMS value of the signal 181.

For example, determination of the RMS value can comprise a 2-stage process. First of all, the signal 181 can be squared, i.e. multiplied by itself, by means of the detector 101. The following is obtained:
y=x$^a$, where x denotes the signal 181 and y denotes the input signal 182. a is a parameter that can be for example a=2. a can also assume other factors, for example in the range 1.5<a<2.5.

In this case, the logarithmic nonlinear characteristic is used to determine the logarithm of the input signal 182; this involves determination of the logarithm in the digital domain being affected by means of the SAR-ADC 110. In particular, the logarithm is achieved as a nonlinear characteristic of the AD conversion by translation of the digital signal 184 by means of the exponential prescribed function 170 by means of the logic element 113 in the digital domain. In this case, the output signal 187 is obtained, which has a bit sequence whose value varies linearly in relation to the RMS value of the input signal 182.

Implementation of the logic element 113 in a digital domain means that a wide variety of variants of the logic element 113 are conceivable. In different scenarios, for example, it could be possible for the logic element 113 to comprise a processor that is configured to compute the translated digital signal 185 on the basis of the prescribed function 170 and on the basis of the digital signal 184. For example, the processor can be coupled to a memory that stores the prescribed function. As such, it could be possible for the prescribed function to be adjusted flexibly.

Figure 2:
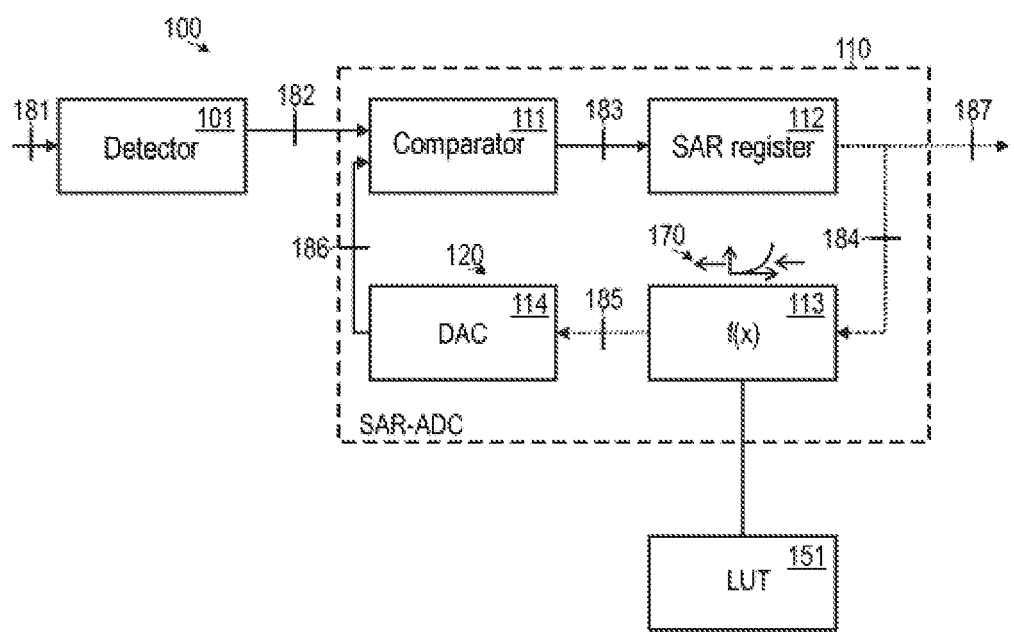
FIG. 2 corresponds to FIG. 1, wherein the logic element is configured to translate the digital signal in accordance with the prescribed function on the basis of a lookup table that is stored in a memory.

With reference to FIG. 2, a further scenario in relation to the implementation of the logic element 113 is shown. In the scenario in FIG. 2, the circuit 100 comprises a memory 151 that is coupled to the logic element 113. The memory 151 is configured to store a lookup table (LUT). The LUT maps the prescribed function 170. The logic element 113 is configured to translate the digital signal 184 in accordance with the prescribed function 170 on the basis of the LUT.

For example, the LUT could contain a respective associated translated digital signal 185 for different digital signals 184. This means that a particular bit sequence of the digital signal 184 can, on the basis of the association of the LUT, be translated into another bit sequence of the translated digital signal 185. The set of associations stored in the LUT can then map the prescribed function 170. As a result of the use of the LUT, it can be possible for translation in the logic element 113 to be implemented in a comparatively simple manner. In particular, it can be dispensable to perform particular computation operations and it can be dispensable to provide an appropriate processor having comparatively high computation power.

In different scenarios, it is possible for the LUT to map more than one prescribed function 170. For example, it could be possible for the feedback path 120 to be configured to translate the digital signal 184 in accordance with a prescribed function 170 in a first mode of operation and to translate said digital signal in accordance with another, further prescribed function in a second mode of operation. As such, it could be possible for the nonlinear characteristic of the SAR-ADC 110, which characteristic is used to translate the input signal 182 into the output signal 187, to be altered depending on the mode of operation. As such, a flexibility in relation to the AD conversion can be increased.

Figure 3:
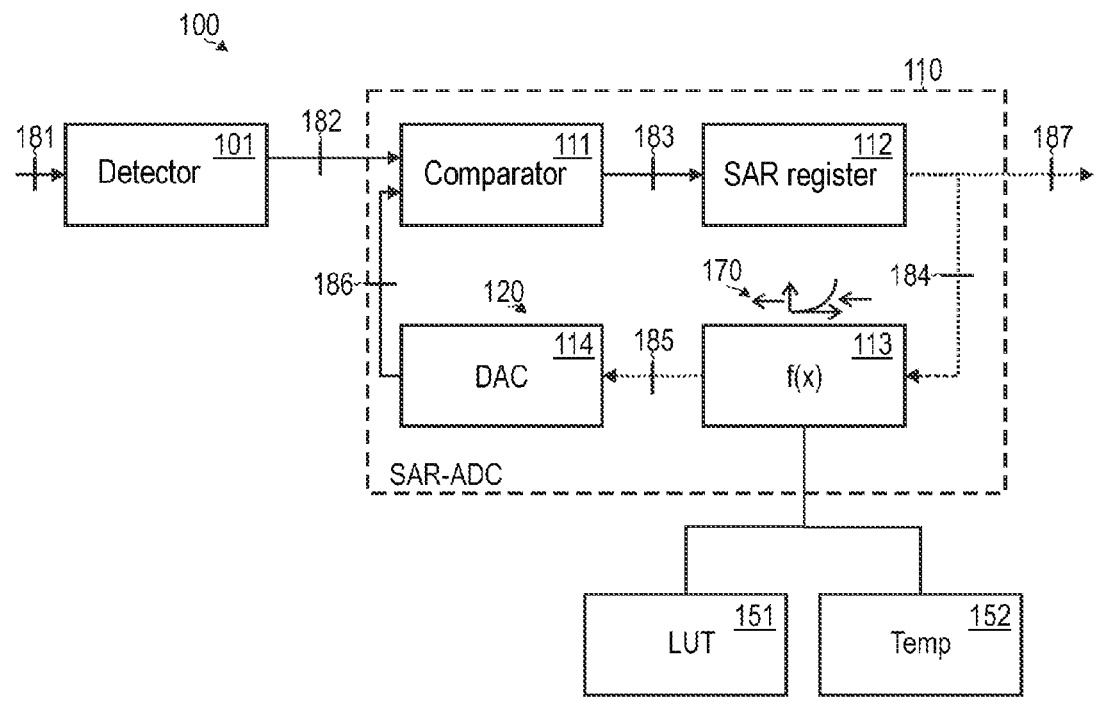
FIG. 3 corresponds to FIG. 2, wherein the circuit furthermore has a temperature sensor, wherein the prescribed function has a dependency on temperature.

With preference to FIG. 3, aspects in relation to a dependency of the prescribed function 170 on temperature are shown. In particular, it is possible for analog components of the circuit 100 to have a significant dependency for operation on temperature. For example, the comparator 111 can have a dependency on temperature. Alternatively or additionally, it could also be possible for DA converter element 114 to have a dependency for operation on temperature. In particular, it is also possible for the detector 101 to have a dependency on temperature.

FIG. 3 illustrates a scenario in which the circuit 110 comprises a temperature sensor 152. The temperature sensor 152 measures the temperature in the region of the circuit 110. In that case, the temperature sensor 152 is configured to provide a control signal that is indicative of the measured temperature. It is then possible for the prescribed function 170 to have a dependency on the measured temperature. For example, in a scenario in which the prescribed function 170 is mapped by the LUT, the LUT could have different associated bit sequences of the translated digital signal 185 for a particular bit sequence of the digital signal 184, the respective association being able to be selected on the basis of the measured temperature. The provision of the dependency of the prescribed function 170 on temperature can reduce or compensate for influences of temperature on the conversion of the input signal 182 into the output signal 187. It is possible for the nonlinear characteristic to be provided in a particularly thermally stable manner.

Figure 4:
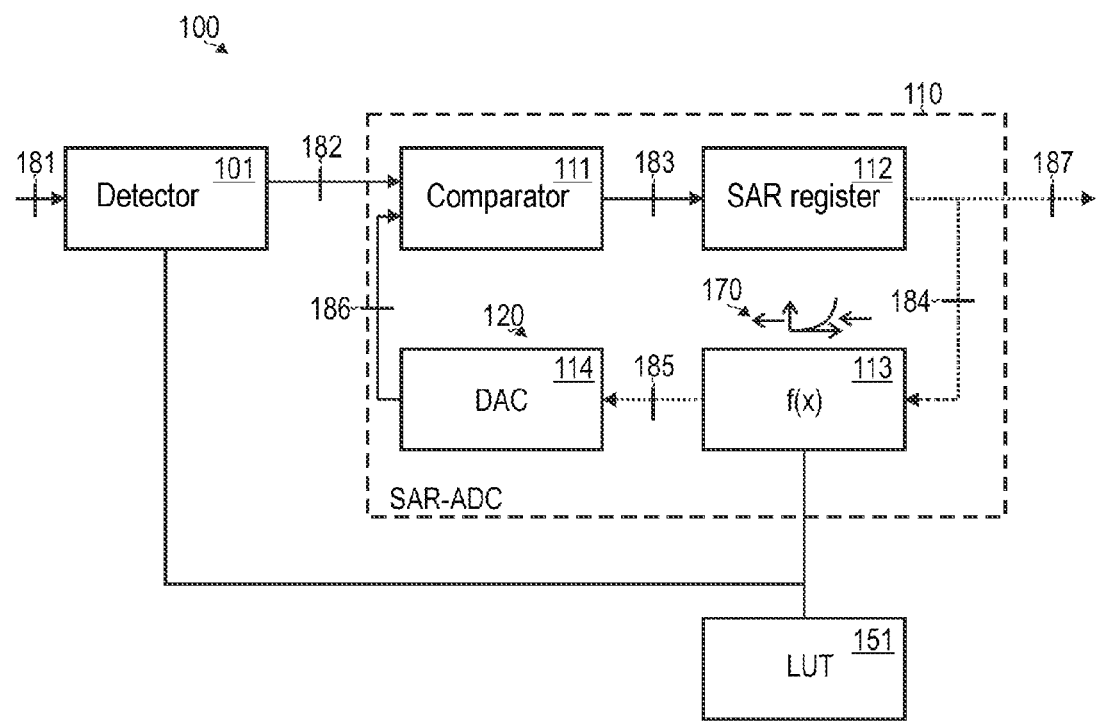
FIG. 4 corresponds to FIG. 2, wherein the prescribed function has a dependency on an operating state of a detector that outputs an analog input signal to the SAR-ADC.

With reference to FIG. 4, aspects are shown that relate to a dependency of the prescribed function 170 on a type or an operating state of the detector 101. As can be seen from FIG. 4, the detector 101 in this scenario has a coupling to the logic element 113. As a result, it is possible for the logic element 113 to implement a dependency for the prescribed function 170 on the type of the detector 101 and/or on an operating state of the detector 101. In particular, as described above, the signal 181 can be preconditioned in a particular manner in the analog domain by the detector 101, for example can be squared. Typically, the preconditioning of the signal 181 can vary depending on the operating state of the detector 101 or depending on the type of the detector 101. In this case, it can be worthwhile to adjust the prescribed function 170 as appropriate in order to balance out or compensate for variations in the preconditioning of the signal 181. For example, in a scenario in which the prescribed function 170 is mapped by the LUT, the LUT could have different associated bit sequences of the translated digital signal 185 for a particular bit sequence of the digital signal 184, the respective association being able to be selected on the basis of the type of the detector 101 or the operating state of the detector 101.

Figure 5:
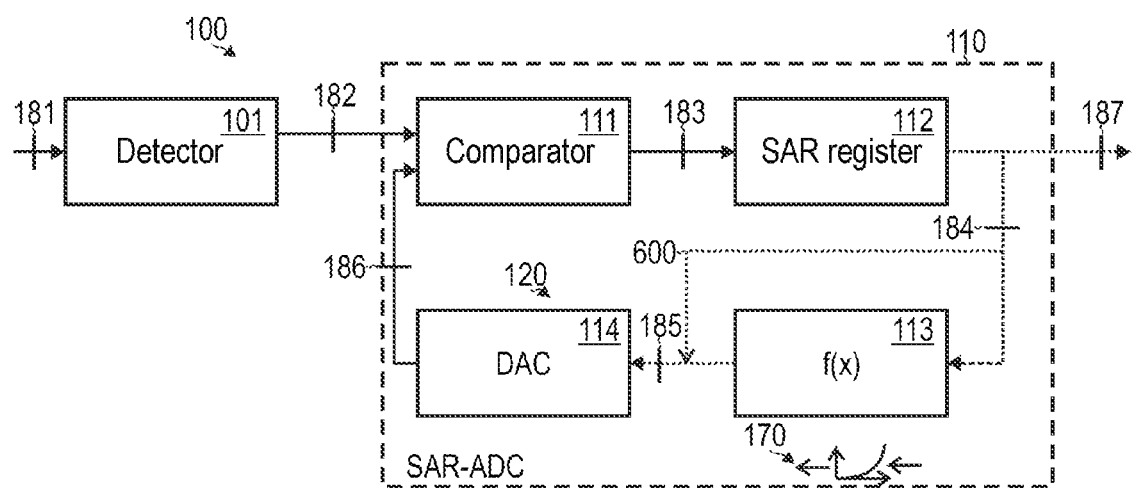
FIG. 5 corresponds to FIG. 1, wherein the feedback path of the SAR-ADC furthermore comprises a selectively activable or actable front path that is configured to bypass the digital logic element.

With reference to FIG. 5, different aspects of a selectively activable shunt path 600, which is configured to bypass the digital logic element 113, are illustrated. In particular, in the scenario in FIG. 5, the feedback path 120 comprises the selectively activable shunt path 600, which prompts the digital signal 184 to be able to be forwarded to the DA converter element 114, possibly without being translated. As such, the effect that can be achieved is that, depending on whether the selectively activable shunt path 600 is active or inactive, the nonlinear characteristic of the SAR-ADC 110, which characteristic is used to convert the input signal 182 into the output signal 187, is adjusted. As such, it can be possible, for example, to change over between a linear-in-dB scale and a linear scale, which corresponds to a linear characteristic of the SAR-ADC 110, for the output signal 187. This means that it is possible to use the shunt path 600 to bypass the nonlinear characteristic. As a result, it is possible to operate the SAR-ADC 110 with a linear or nonlinear characteristic, depending on the application.

In different scenarios, it is possible for the shunt path 600 to be implemented by appropriate hardware. For example, the shunt path 600 could be implemented by one or more switches and a dedicated conductor track. In further scenarios, however, it is also possible for the shunt path 600 to be implemented by a software, firmware or combination thereof. For example, it could be possible for the feedback path 120 to be configured to translate the digital signal 184 in accordance with the prescribed function 170 in the first mode of operation and to translate said digital signal in accordance with an identity function in the second mode of operation. The identity function prompts the digital signal 184 to be transferred to the DA converter element 114 without alteration, i.e. identically. The digital signal 184 and the translated digital signal 185 can then be identical.

The text above has illustrated techniques that allow the digital logic element 113 in the feedback path 120 of the SAR-ADC 110 to be used to implement the nonlinear characteristic that is used by the SAR-ADC 110 to convert the input signal 182 into the output signal 187. The nonlinear characteristic has a dependency on the prescribed function 170. Therefore, it can be worthwhile to implement the prescribed function 170 flexibly on the basis of the specific application. For example, it can be worthwhile to choose the prescribed function 170 as an exponential function, so that the nonlinear characteristic is in logarithmic form.

Figure 6:
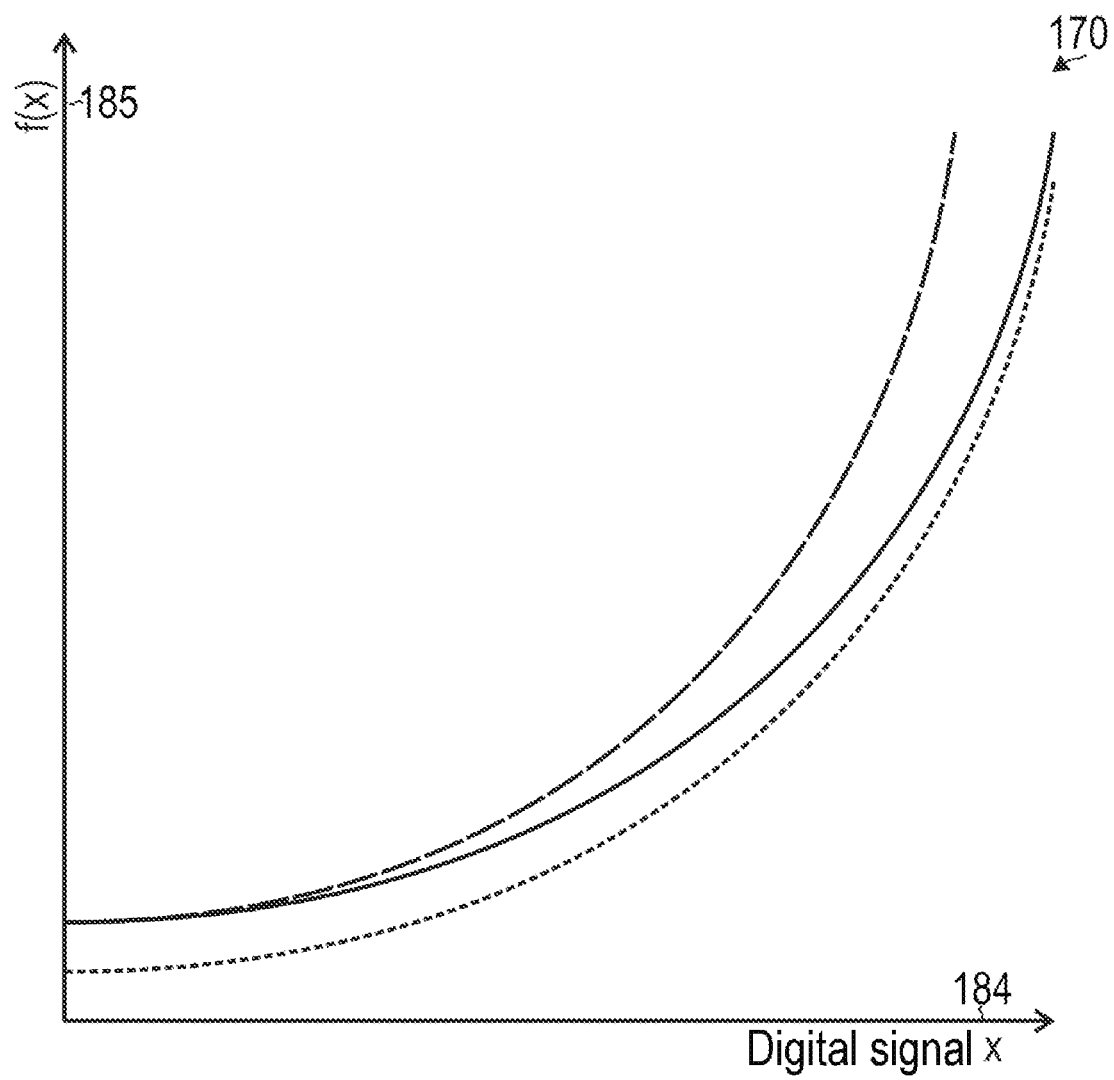
FIG. 6 illustrates nonlinear exponential prescribed functions in accordance with different embodiments, wherein the functions are characterized by a slope and a zero point offset.

With reference to FIG. 6, different aspects relating to the prescribed function 170 are presented. The prescribed function 170 is used by the digital logic element 113 to translate the digital signal 184 into the translated digital signal 185. For example, the prescribed function 170, as shown in FIG. 6, can be a nonlinear function. In particular, it will be possible, as shown in FIG. 6, for the prescribed function 170 to be an exponential function. The exponential function can be described by the following dependency, in particular: $f(x)=\exp(x)$, where x denotes the value of the digital signal 184.

The exponential function 170 is typically characterized by a particular slope; for example, in the scenario in FIG. 6, a first prescribed function 170 (solid line) has a first slope and a second and third prescribed function (dashed line and dotted line) have a second slope, the second slope being greater than the first slope. Depending on the application, translation of the digital signal 184 into the translated digital signal 185 can be adjusted in such a manner and hence the nonlinear characteristic of the SAR-ADC 110 can be adjusted.

Typically, the exponential function 170 is furthermore characterized by a particular zero point offset. In a scenario in FIG. 6, the first and second exponential functions 170 have a first zero point offset and the third exponential function 170 has a second zero point offset, the first zero point offset being greater than the second zero point offset. Depending on the application, translation of the digital signal 184 into the translated digital signal 185 can be adjusted in such a manner and hence the nonlinear characteristic of the SAR-ADC 110 can be adjusted.

In one example, it is possible for parameters of the prescribed function 170 such as the slope or the zero point offset to be adjusted on the basis of the temperature measured by the temperature sensor 152 and/or on the basis of a type of the detector 101 and/or on the basis of an operating state of the detector 101.

Figure 7:
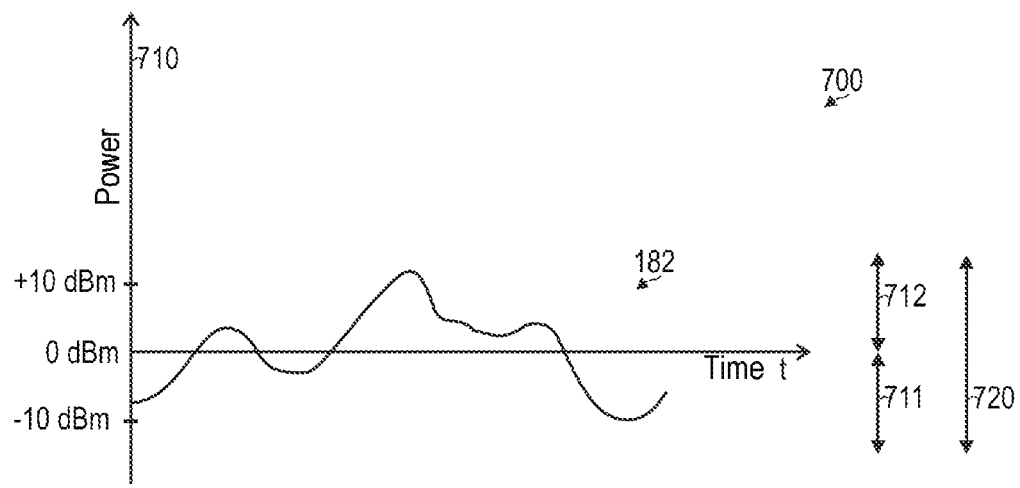
FIG. 7 illustrates a power curve for the input signal, wherein the power curve has a wide dynamic range.
Figure 8:
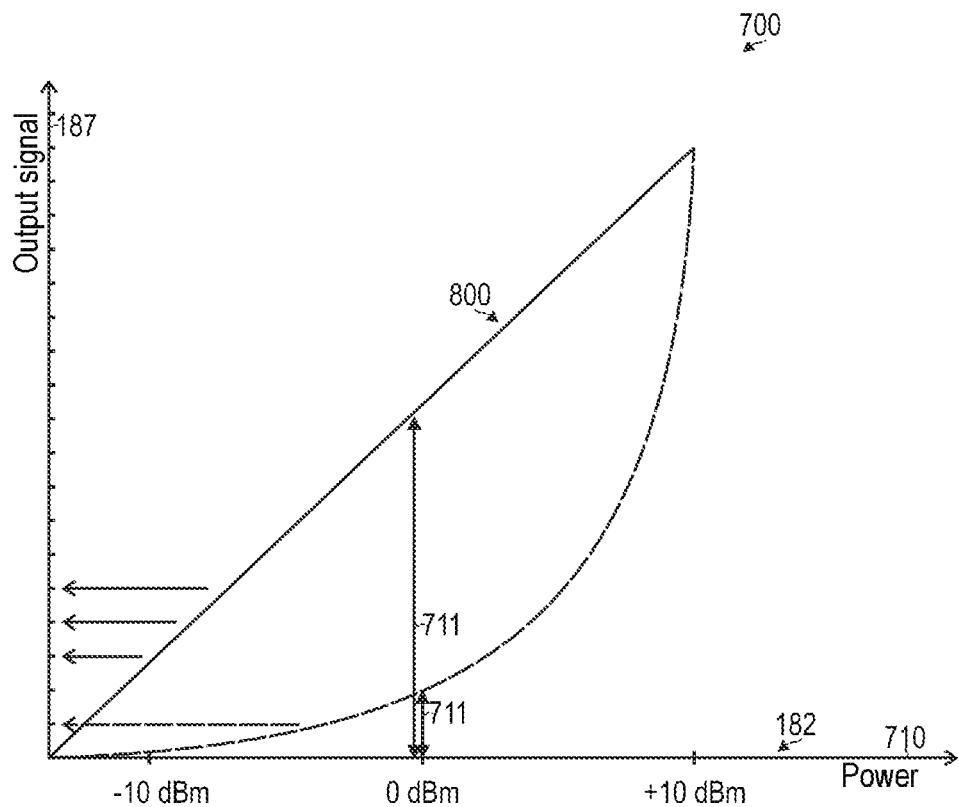
FIG. 8 illustrates the nonlinear characteristic of the SAR-ADC.
Figure 9:
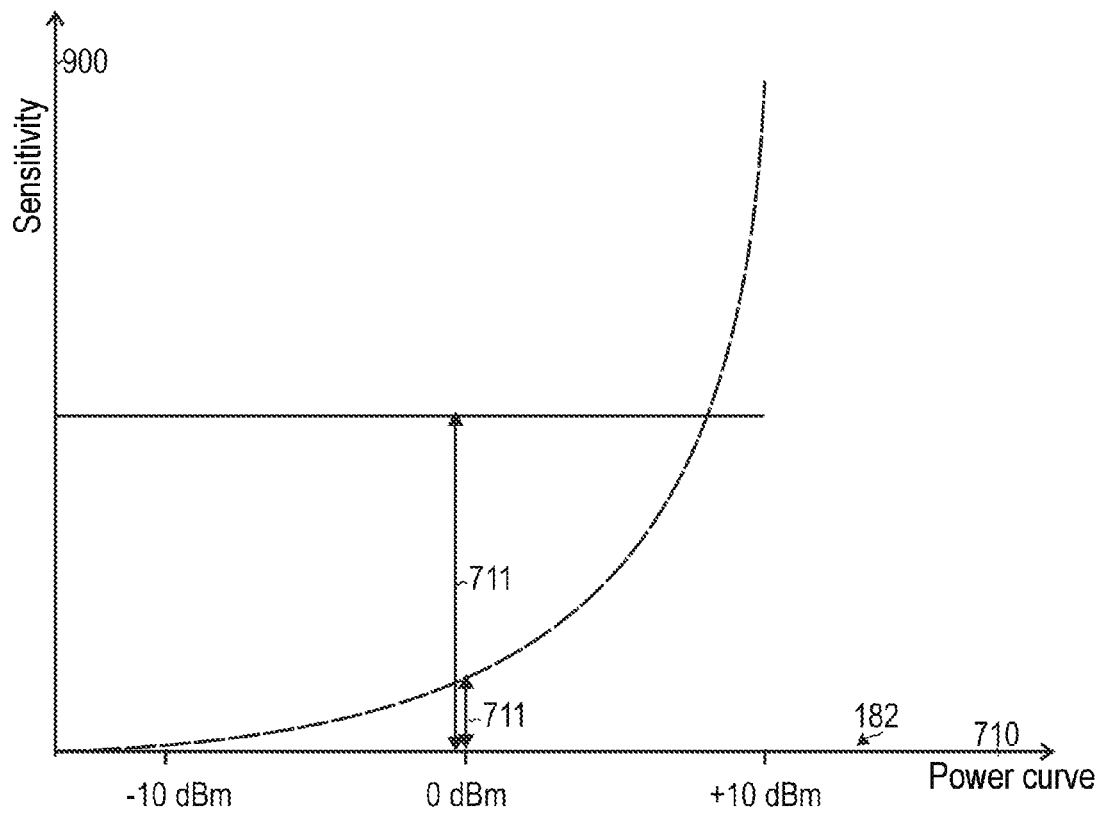
FIG. 9 illustrates a range a sensitivity of the nonlinear characteristic of the SAR-ADC.

With reference to FIGS. 7, 8 and 9, details relating to aspects of the nonlinear characteristic that is used to convert the input signal 182 into the output signal 187 are presented below. FIG. 7 illustrates the power 710 of the input signal 182 as a function of time (power curve 700). As is evident from FIG. 7, the power 710 of the input signal 182 varies in a wide dynamic range 720 that extends over multiple orders of magnitude. The power curve 700 accordingly comprises a first range 711 and a second range 712. In this case, the first range 711 corresponds to lower powers 710 of the input signal 182 than the second range 712.

The techniques described herein can be used to perform a reliable and accurate AD conversion in the whole dynamic range 720. In particular, it can be possible for the nonlinear characteristic of the SAR-ADC 110 to be used to convert the first range 711 too with a high sensitivity AD.

FIG. 8 illustrates the value of the output signal 187 as a function of the power 710 of the input signal 182; in this case, the solid line illustrates a nonlinear characteristic 800 and the dashed line illustrates a linear characteristic 800 that is used to convert the input signal 182 into the output signal 187 (the logarithmic scaling of the power axis, shown horizontally in FIG. 8 should be noted). Provided that the AD conversion takes place with the nonlinear characteristic 800, the output signal 187 is provided on a linear-in-dB scale (shown by the straight line of the solid line in FIG. 8).

FIG. 8 reveals that in the case of the linear characteristic 800 (dashed line), the first range 711 has only a single associated digital value of the discretized output signal 187 (shown by the ticks on the vertical axis and the dashed horizontal arrow in FIG. 8); therefore, the AD conversion using the linear characteristic 800 is not effected with a recognizable sensitivity.

FIG. 8 also reveals that in the case of the nonlinear characteristic 800, the first range 711 of the power curve 700 of the input signal 182 is assigned a greater value range in relation to the described output signal 187 (shown by the ticks on the vertical axis and the solid horizontal arrows in FIG. 8); therefore, the AD conversion using the linear characteristic is not effected with a recognizable sensitivity 800.

In detail, a slope of the curves shown in FIG. 8 corresponds to a sensitivity with which AD conversion is performed; in this case, a lesser (greater) slope corresponds to a lower (higher) sensitivity. FIG. 9 illustrates the sensitivities 900 for the nonlinear characteristic 800 (solid line) and the linear characteristic 800 (dashed line). FIG. 9 reveals that the first range 711 of the input signal and the second range 712 of the input signal 182 are converted with essentially the same sensitivities in the case of the nonlinear characteristic 800. In particular, AD conversion is effected with a constant sensitivity 900 over the whole dynamic range 720. In particular, a sensitivity 900 with which the first range 711 of the input signal 182 is converted is comparatively high and recognizable. The recognizable sensitivity 900 can mean that the output signal 187 has a sufficient number of data points in relation to the first range 711. As such, a high resolution for the AD conversion an also be achieved in the first range 711, which corresponds to lower powers.

Figure 10:
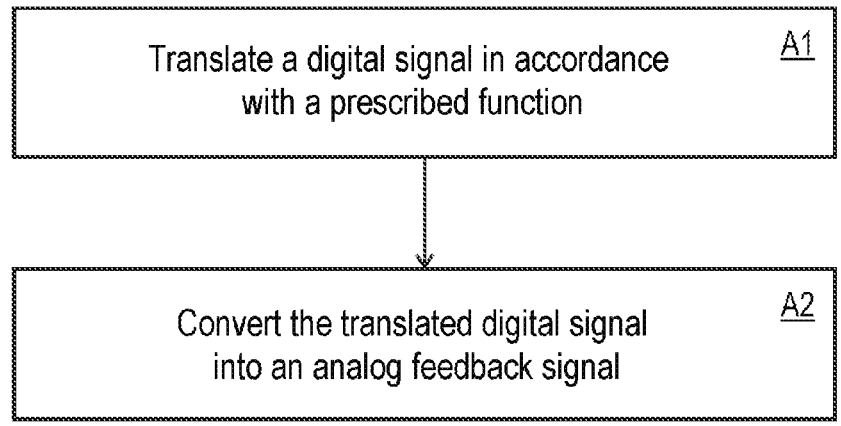
FIG. 10 is a flowchart for a method in accordance with different embodiments.

FIG. 10 illustrates a flowchart for a method in accordance with different embodiments. The method comprises conversion of the digital signal 184 in accordance with the prescribed function 170 in the feedback path 120 of the SAR-ADC 110, A1. In this case, the prescribed function 170 can be, for example, a nonlinear function, for example in particular an exponential function. Translation of the digital signal 184 into the translated digital signal 185 can be performed by the logic element 113, for example. In this case, the logic element 113 can be coupled to the memory 151, for example, which stores the LUT. In that case, it can be possible for the logic element 113 to use the LUT to implement translation of the digital signal 184 into the translated digital signal 185.

In different embodiments, it is possible for step A1 to be carried out selectively; for example, the shunt path 600 can be used to bypass translation of the digital signal 184 into the translated digital signal 185.

The method furthermore comprises conversion of the translated digital signal 185 into the analog feedback signal 186 in the feedback path 120 of the SAR-ADC 110, A2. For example, A2 can be performed by the DA converter element 114.

The method can for example furthermore comprise comparison of the feedback signal 186 with the input signal and output of the result signal 183 on the basis of the comparison.

The method can furthermore comprise iterative adjustment of the digital signal 184 on the basis of the result signal 183.

Figure 11:
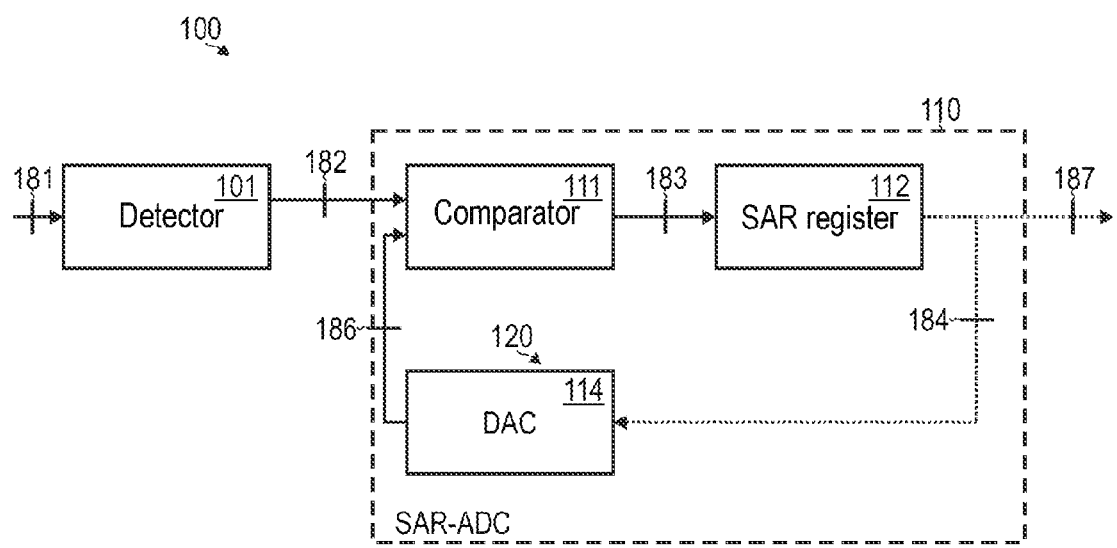
FIG. 11 illustrates an SAR-ADC in accordance with a previously known reference implementation.

FIG. 11 illustrates a previously known SAR-ADC 110 in accordance with implementations. In the case of the previously known SAR-ADC 110, the digital signal 184 is transferred to the digital-to-analog converter element 114 without translation. However, there is no logic element 113 that is set up to translate the digital signal 184.

In summary, the text above has explained techniques that implement an AD conversion on the basis of the successive approximation method. The relevant SAR-ADC comprises a feedback path with a prescribed function. For example, the prescribed function can have an exponential dependency. In combination with a conventional linear DA converter element, it is then possible for a logarithmic characteristic of the AD conversion to be implemented.

As such, different advantages can be obtained. A particular advantage lies in the severe reduction of analog circuitry, which typically reacts to fluctuations in temperature, offset voltages and process variations in a particularly sensitive manner. In particular, translation can take place in the digital domain on the basis of the prescribed function.

Such techniques can be used in a wide variety of fields. One specific area of application is determination of an RMS value for an input signal, such as a radiofrequency signal, for example.

Examples herein can include subject matter such as a method, means for performing acts or blocks of the method, at least one machine-readable medium including executable instructions that, when performed by a machine (e.g., a processor with memory or the like) cause the machine to perform acts of the method or of an apparatus or system for concurrent communication using multiple communication technologies according to embodiments and examples described.

Example 1

A circuit that comprises: a successive approximation analog-to-digital converter, SAR-ADC, wherein the SAR-ADC comprises a feedback path, wherein the feedback path is configured to translate a digital signal in accordance with a prescribed function and to furthermore convert the translated digital signal into an analog feedback signal.

Example 2

The circuit according to example 1, wherein the feedback path comprises a digital logic element and a digital-to-analog converter element, wherein the digital logic element is configured to translate the digital signal in accordance with the prescribed function, wherein the digital-to-analog converter element is configured to convert the translated digital signal into the analog feedback signal.

Example 3

The circuit according to example 2, furthermore comprising: a memory that is configured to store a lookup table that maps the prescribed function, wherein the logic element is configured to translate the digital signal in accordance with the prescribed function on the basis of the lookup table.

Example 4

The circuit according to example 2 or 3, wherein the feedback path furthermore comprises a selectively activable shunt path that is configured to bypass the digital logic element.

Example 5

The circuit according to one of the preceding examples, wherein the prescribed function is a nonlinear function.

Example 6

The circuit according to one of the preceding examples, wherein the prescribed function is an exponential function.

Example 7

The circuit according to one of the preceding examples, wherein the prescribed function has a zero point offset.

Example 8

The circuit according to one of the preceding examples, wherein the feedback path is configured to translate the digital signal in accordance with the prescribed function in a first mode of operation and to translate said digital signal in accordance with a further prescribed function in a second mode of operation.

Example 9

The circuit according to example 8, wherein the further prescribed function is the identity function.

Example 10

The circuit according to one of the preceding examples, furthermore comprising: a temperature sensor that is configured to output a control signal to the digital logic element, wherein the control signal is indicative of a measurement temperature, wherein the prescribed function has a dependency on the measured temperature.

Example 11

The circuit according to one of the preceding examples, furthermore comprising: a detector that is configured to output an analog input signal to the SAR-ADC.

Example 12

The circuit according to example 11, wherein the prescribed function has a dependency on a type of the detector.

Example 13

The circuit according to example 11 or 12, wherein the prescribed function has a dependency on an operating state of the detector.

Example 14

The circuit according to one of the preceding examples, wherein the SAR-ADC furthermore comprises a comparator that is configured to compare an analog input signal received by the SAR-ADC with the feedback signal and to take the comparison as a basis for outputting a result signal.

Example 15

The circuit according to example 14, wherein the SAR-ADC furthermore comprises an SAR register configured to adjust the digital signal iteratively on the basis of the result signal.

Example 16

The circuit according to one of the preceding examples, wherein the SAR-ADC is configured to convert an analog input signal received by the SAR-ADC by means of a nonlinear characteristic.

Example 17

A method that comprises: a feedback path of an SAR-ADC translates a digital signal in accordance with a prescribed function, in which the feedback path of the SAR-ADC converts the translated digital signal into an analog feedback signal.

Example 18

The method according to example 17, wherein the method is carried out by a circuit as claimed in one of claims 1-16.

Example 19

A hybrid analog-to-digital converter that comprises: a comparator that is configured to compare an analog input signal with a feedback signal and to take the comparison as a basis for outputting a result signal, wherein the input signal has a power curve having a first range and a second range, wherein the first range corresponds to lower powers than the second range, an SAR register that is configured to adjust a digital signal iteratively on the basis of the result signal, wherein the hybrid analog-to-digital converter is configured to use a nonlinear characteristic to convert the first range of the power curve of the input signal with a recognizable sensitivity.

Example 20

The hybrid analog-to-digital converter according to example 19, wherein the hybrid analog-to-digital converter is configured to convert the first range of the power curve of the input signal with a first sensitivity and to convert the second range of the power curve of the input signal with a second sensitivity, wherein the first sensitivity is essentially equal to the second sensitivity.

Example 21

The hybrid analog-to-digital converter according to example 19 or 20, wherein the input signal is a radiofrequency signal.

Example 22

The hybrid analog-to-digital converter according to one of examples 19-21, wherein the hybrid analog-to-digital converter is configured to use the nonlinear characteristic to translate the power curve of the input signal from a dB scale into a linear scale.

Example 23

The hybrid analog-to-digital converter according to one of examples 19-22, wherein the nonlinear characteristic has a dependency on a type of the detector, wherein the detector is configured to provide the input signal and to output the feedback signal.

Example 24

The hybrid analog-to-digital converter according to one of examples 19-23, furthermore comprising: a feedback path that is configured to feed back the digital signal.

Example 25

The hybrid analog-to-digital converter according to one of examples 19-24, wherein the hybrid analog-to-digital converter is arranged on a single semiconductor chip or bonded chip.

Example 26

The hybrid analog-to-digital converter according to one of examples 19-25, furthermore comprising: a shunt path that bypasses the nonlinear characteristic.

Example 27

The hybrid analog-to-digital converter according to one of examples 19-26, wherein the hybrid analog-to-digital converter comprises the circuit according to one of examples 1-16.

The features of the embodiments and aspects of the disclosure described above can be combined with one another. In particular, the features can be used not only in the combinations described, but also in other combinations or individually without departing from the field of the disclosure.

The text above has described a wide variety of aspects in relation to the power of the input signal, converted using a nonlinear characteristic AD. In further scenarios, it could be possible for the input signal to have a curve for another characteristic quantity that is converted by means of the nonlinear characteristic AD. Examples of further characteristic quantities comprise such as voltage, field strength, light, temperature and magnetic field.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature may have been disclosed with respect to only one of several implementations, such feature may be combined with one or more other features of the other implementations as may be desired and advantageous for any given or particular application.

The invention claimed is:
1. A circuit comprising:
a successive approximation analog-to-digital converter (SAR-ADC) comprising a feedback path;
wherein the feedback path is configured to translate a digital signal in accordance with a prescribed function and to furthermore convert the translated digital signal into an analog feedback signal.
2. The circuit of claim 1, wherein the feedback path comprises a digital logic element and a digital-to-analog converter element;
wherein the digital logic element is configured to translate the digital signal in accordance with the prescribed function;
wherein the digital-to-analog converter element is configured to convert the translated digital signal into the analog feedback signal.
3. The circuit of claim 2, further comprising:
a memory configured to store a lookup table that maps the prescribed function;
wherein the digital logic element is configured to translate the digital signal in accordance with the prescribed function based on the lookup table.
4. The circuit of claim 2, wherein the feedback path further comprises a selectively activable shunt path configured to bypass the digital logic element.
5. The circuit of claim 1, wherein the prescribed function comprises a nonlinear function.
6. The circuit of claim 1, wherein the prescribed function comprises an exponential function.
7. The circuit of claim 1, wherein the prescribed function comprises a zero point offset.
8. The circuit of claim 1, wherein the feedback path is further configured to translate the digital signal in accordance with the prescribed function in a first mode of operation and to translate the digital signal in accordance with a further prescribed function in a second mode of operation.
9. The circuit of claim 8, wherein the further prescribed function comprises an identity function.
10. The circuit of claim 1, further comprising:
a temperature sensor configured to output a control signal to the digital logic element;
wherein the control signal comprises an indication of a measured temperature;
wherein the prescribed function comprises a dependency on the measured temperature.

11. The circuit of claim 1, further comprising:
a detector configured to output an analog input signal to the SAR-ADC.

12. The circuit of claim 11, wherein the prescribed function comprises a dependency on a type of the detector.

13. The circuit of claim 11, wherein the prescribed function comprises a dependency on an operating state of the detector.

14. The circuit of claim 1, wherein the SAR-ADC furthermore comprises a comparator configured to generate a comparison of an analog input signal received by the SAR-ADC with the feedback signal and output a result signal based on the comparison.

15. The circuit of claim 14, wherein the SAR-ADC further comprises an SAR register configured to adjust the digital signal iteratively based on the result signal.

16. The circuit of claim 1, wherein the SAR-ADC is configured to receive an analog input signal and convert the analog input signal with a nonlinear characteristic.

17. A method comprising:
translating, via a feedback path of an SAR-ADC, a digital signal in accordance with a prescribed function; and
converting, via the feedback path of the SAR-ADC, the translated digital signal into an analog feedback signal.

18. The method of claim 17, further comprising:
storing a lookup table that maps the prescribed function; and
bypassing, via a selectively activable shunt path, a digital logic element of the feedback path;
wherein the translating the digital signal in accordance with the prescribed function comprises translating the digital signal based on the lookup table.

19. A hybrid analog-to-digital converter comprising:
a comparator configured to generate a comparison an analog input signal with a feedback signal and output a result signal based on the comparison, wherein the analog input signal comprises a power curve including a first range and a second range, and wherein the first range corresponds to lower powers than the second range; and
a successive approximation analog-to-digital converter (SAR) register configured to adjust a digital signal iteratively based on the result signal, wherein the hybrid analog-to-digital converter is configured to use a nonlinear characteristic to convert the first range of the power curve of the input signal with a recognizable sensitivity.

20. The hybrid analog-to-digital converter of claim 19, wherein the hybrid analog-to-digital converter is further configured to convert the first range of the power curve of the input signal with a first sensitivity and to convert the second range of the power curve of the input signal with a second sensitivity, and wherein the first sensitivity is substantially equal to the second sensitivity.

* * * * *